(12) United States Patent
Daubenspeck et al.

(10) Patent No.: US 8,138,602 B2
(45) Date of Patent: Mar. 20, 2012

(54) SOLDER INTERCONNECT PADS WITH CURRENT SPREADING LAYERS

(75) Inventors: Timothy Harrison Daubenspeck, Colchester, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/885,709

(22) Filed: Sep. 20, 2010

(65) Prior Publication Data

US 2011/0006421 A1 Jan. 13, 2011

Related U.S. Application Data

(62) Division of application No. 12/032,158, filed on Feb. 15, 2008, now Pat. No. 7,868,453.

(51) Int. Cl.
*H01L 23/498* (2006.01)

(52) U.S. Cl. ...................................... 257/737

(58) Field of Classification Search ............... 257/738, 257/737, 734, 779; 438/612, 614, 622, 638
See application file for complete search history.

(56) References Cited

U.S. PATENT DOCUMENTS

| | | | |
|---|---|---|---|
| 6,333,559 B1 | 12/2001 | Costrini et al. | |
| 6,617,690 B1 | 9/2003 | Gates et al. | |
| 6,960,828 B2 | 11/2005 | Nair et al. | |
| 7,611,041 B2 | 11/2009 | Tago et al. | |
| 2002/0093096 A1* | 7/2002 | Tago et al. | 257/738 |
| 2004/0255258 A1 | 12/2004 | Li | |
| 2006/0018175 A1 | 1/2006 | Liljedahl et al. | |
| 2006/0249848 A1 | 11/2006 | Coolbaugh et al. | |
| 2006/0292788 A1 | 12/2006 | Vaartstra | |
| 2007/0228561 A1* | 10/2007 | Matsuki et al. | 257/737 |

OTHER PUBLICATIONS

Notice of Allowance (Mail Date Sep. 1, 2010) for U.S. Appl. No. 12/032,158, filed Feb. 15, 2008; Confirmation No. 3847.
Liu et al.; Under Bump Metallisation of Fine Pitch Flip-chip Using Electroless Nickel Deposition; Proceedings of International Symposium on Electronic Materials and Packaging, Nov. 30-Dec. 2, 2000, Hong Kong; pp. 64-71.
Leng et al.; Cr/Cu/Ni Underbump Metallization Study; Electronic Components and Technology Conference, 51st, Orlando, May 26-Jun. 1, 2001, Proceedings; pp. 939-944.
Jang et al.; Pb-Free Bumping Technology and UBM (Under Bump Metallurgy); Advances in Electronic Materials and Packaging 2001, Proceedings of International Symposium, Jeju Island, South Korea, Nov. 19-22, 2001; pp. 121-128.

(Continued)

*Primary Examiner* — Marcos D. Pizarro
*Assistant Examiner* — Suian Tang
(74) *Attorney, Agent, or Firm* — Schmeiser, Olsen & Watts; Richard Kotulak

(57) ABSTRACT

Structure and methods of making the structures. The structures include a structure, comprising: an organic dielectric passivation layer extending over a substrate; an electrically conductive current spreading pad on a top surface of the organic dielectric passivation layer; an electrically conductive solder bump pad comprising one or more layers on a top surface of the current spreading pad; and an electrically conductive solder bump containing tin, the solder bump on a top surface of the solder bump pad, the current spreading pad comprising one or more layers, at least one of the one or more layers consisting of a material that will not form an intermetallic with tin or at least one of the one or more layers is a material that is a diffusion barrier to tin and adjacent to the solder bump pad.

6 Claims, 8 Drawing Sheets

OTHER PUBLICATIONS

Gupta et al.; Effect of Intermetallic Compounds on Reliability of Sn-Ag-Cu Flip Chip Solder Interconnects for Different Substrate Pad Finishes and Ni/Cu UBM; Electronic Components and Technology Conference, 54th, Las Vegas, Jun. 1-4, 2004, 2004 Proceedings; pp. 68-74.

Jang et al.; Eutectic Pb/Sn Solder Bump and Under Bump Metallurgy Interfacial Reactions and Adhesion; Electronics Packaging Technology Conference, 2nd, Singapore, Dec. 8-10, 1998, Proceedings; pp. 69-75.

* cited by examiner

SOLDER INTERCONNECT PADS WITH CURRENT SPREADING LAYERS

This Application is a division of U.S. patent application Ser. No. 12/032,158 filed on Feb. 15, 2008, now U.S. Pat. No. 7,868,453, issued Jan. 11, 2011.

FIELD OF THE INVENTION

The present invention relates to the field of integrated circuits; more specifically, it relates to solder interconnect pads with a current spreader and methods of fabricating solder interconnect pads having current spreaders.

BACKGROUND OF THE INVENTION

As the density of integrated circuits has increased and the dimensions of terminal pads has decreased, solder interconnect electromigration performance has become an issue. Electromigration (the movement of metal in a wire, ultimately resulting in a void) performance of solder pads is complicated and limited by the interactive nature of conventional solder terminal structures and materials of such structures which form intermetallic compounds. For advanced technologies which use lead free solder materials with high tin contents, the electromigration lifetime (time to failure caused by electromigration) is directly dependent upon thermal process history as tin reacts with the metals used in the integrated circuit chip pads to form a dynamic matrix of intermetallic compounds. Electromigration lifetime is also inherently dependent upon current density. As more and intermetallics are formed, current density increases in the area of the intermetallics, leading to localized heating which increases intermetallic formation in an ever increasing cycle, ultimately resulting in electromigration void/high resistance failures. Therefore, there exists a need in the art to overcome the deficiencies and limitations described hereinabove.

SUMMARY OF THE INVENTION

A first aspect of the present invention is a structure, comprising: an organic dielectric passivation layer extending over a substrate; an electrically conductive current spreading pad on a top surface of the organic dielectric passivation layer; an electrically conductive solder bump pad comprising one or more layers on a top surface of the current spreading pad; and an electrically conductive solder bump containing tin, the solder bump pad on a top surface of the solder bump pad, the current spreading pad comprising one or more layers, at least one of the one or more layers consisting of a material that will not form an intermetallic with tin or at least one of the one or more layers is a material that is a diffusion barrier to tin and is adjacent to the solder bump pad.

A second aspect of the present invention is a method comprising: (a) forming an organic dielectric passivation layer extending over a substrate; after (a), (b) forming an electrically conductive current spreading pad on a top surface of the organic dielectric passivation layer; after (b), (c) forming an electrically conductive solder bump pad comprising one or more layers on a top surface of the current spreading pad; and after (c), (d) forming an electrically conductive solder bump on a top surface of the solder bump pad, the solder bump containing tin, the current spreading pad comprising one or more layers, at least one of the one or more layers consisting of a material that will not form an intermetallic with tin or at least one of the one or more layers is a material that is a diffusion barrier to tin and is adjacent to the solder bump pad.

BRIEF DESCRIPTION OF THE DRAWINGS

The features of the invention are set fourth in the appended claims. The invention itself, however, will be best understood by reference to the following detailed description of an illustrative embodiment when read in conjunction with the accompanying drawings, wherein:

DETAILED DESCRIPTION OF THE INVENTION

An intermetallic is defined as a solid phase compound containing two or more metallic elements, with optionally one or more non-metallic elements, whose structure is distinct from that of any of the constituents. Alloys, which are a homogeneous mixture of metals, and interstitial compounds such as carbides and nitrides are excluded under this definition. Examples of materials that form intermetallic compounds with tin include, but are not limited to copper, nickel, gold, platinum, antimony and palladium indium. Examples of materials that do not form intermetallic compounds with tin include, but are not limited to aluminum, titanium, tantalum and tungsten.

Figure 1A:
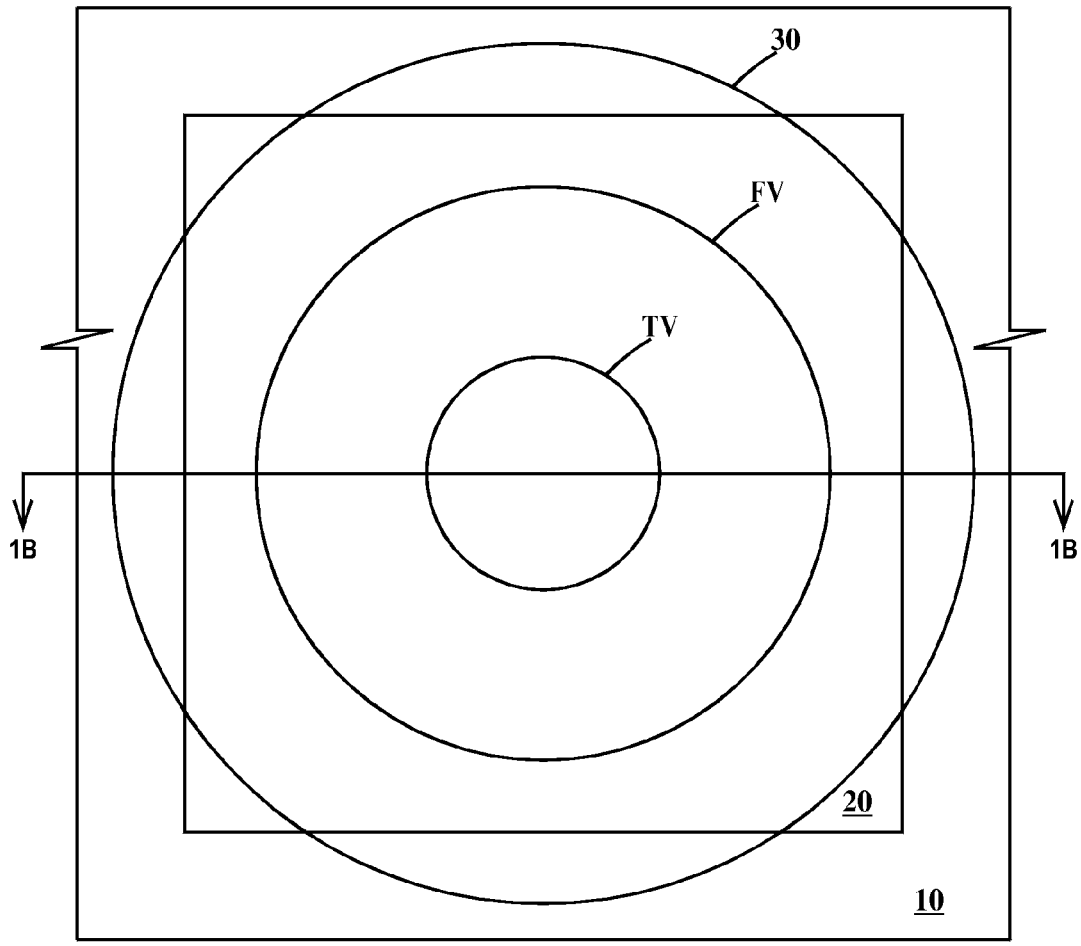
FIG. 1A is a plan view and FIG. 1B is a cross-section view through 1B-1B of FIG. 1A of a solder interconnect pad of the prior art.
Figure 1B:
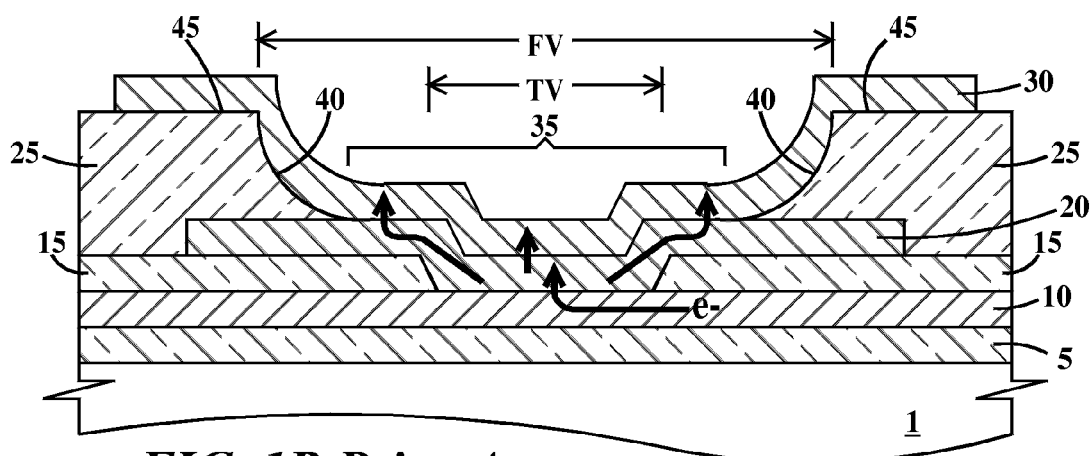

FIG. 1A is a plan view and FIG. 1B is a cross-section view through 1B-1B of FIG. 1A of a solder interconnect pad of the prior art. FIGS. 1A and 1B illustrate the problem solved by the embodiments of the present invention. In FIG. 1B, formed on a substrate 1 is a set (not fully shown) of interlevel dielectric layers containing wires. Interlevel dielectric layer 5 is an uppermost interlevel dielectric layer and wire 10 is an uppermost wire of that set of wires of interlevel dielectric layers containing wires. Formed on a top surface of wire 10 and interlevel dielectric layer 5 where interlevel dielectric layer is not covered (not shown) by wire 10, is a dielectric passivation layer 15. Formed in dielectric passivation layer 15 is an opening TV (terminal via). Formed on a top surface of dielectric passivation layer 15 is an electrically conductive terminal pad 20. In opening TV, a region of pad 20 is in physical and electrical contact with wire 10. Formed on a top surface of terminal pad 20 is an organic dielectric passivation layer 25. Organic dielectric passivation layer 25 is also formed on the top surface of dielectric passivation layer 15 where dielectric passivation layer 15 is not covered by terminal pad 20. Formed in organic dielectric passivation layer 25 is an opening FV (final via). Organic dielectric passivation layer 25 has a concave sidewall 40 in opening FV. Formed on a top surface 45 and sidewalls 40 of organic dielectric passivation layer 25 and on terminal pad exposed in opening FV is an electrically conductive solder bump pad 30. A solder bump (not shown) is formed only in physical and electrical contact with the top surface of solder bump pad 30.

When electron current flows from wire 10 into terminal pad 20 it spreads out as illustrated in FIG. 1B. From terminal pad 20, current flows into solder bump pad 30. Before any heating, such as from reflowing a solder bump (not shown) or passing current from wire 10 to the solder bump current is spread out, and the current density is relatively uniform, along the whole surface of solder bump pad 30. However, after heating current spreading is limited to an area of current spreading 35 which is greater than the area of the TV opening but less than the area of the FV opening. Very little current flows in the region of solder bump pad 30 that extends past the FV opening (i.e., that region between the perimeter of the FV opening and the perimeter of the solder bump pad. This occurs because of reactions between the metals of solder bump pad 30 and the solder bump (not shown) formed on the solder bump pad. These reactions form intermetallics that are not as conductive as the pure metals initially deposited in the solder bump pad. The intermetallics are formed along the length the solder bump pad and particularly form at the cusp between top surface 45 and concave sidewall 40 of organic dielectric passivation layer 25. Heating can occur from fabrication cycles, such as reflow of solder bumps and from current flow itself during testing and then during normal operation of an integrated circuit containing the terminal structure illustrated in FIGS. 1A and 1B.

The embodiments of the present address the factors of current spreading, intermetallic formation and cusping.

Figure 2A:
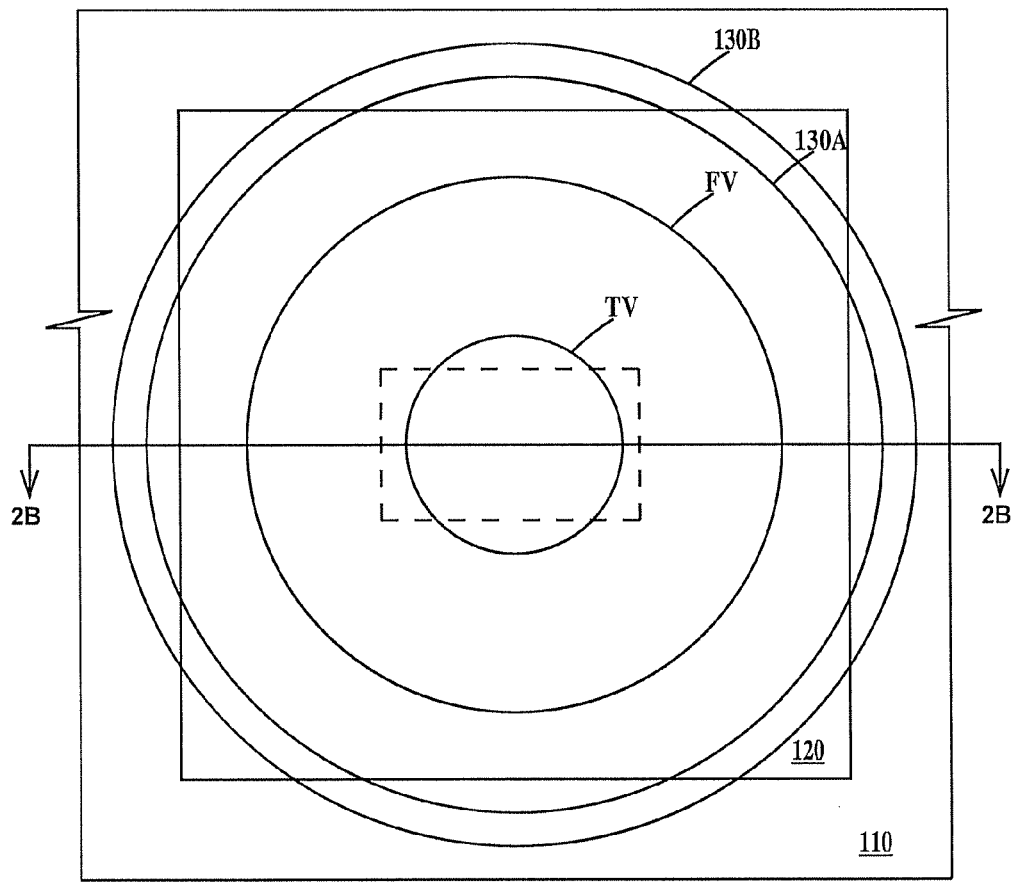
FIG. 2A is a plan view and FIG. 2B is a cross-section view through 2B-2B of FIG. 2A of a solder interconnect pad according to a first embodiment of the present invention.
Figure 2B:
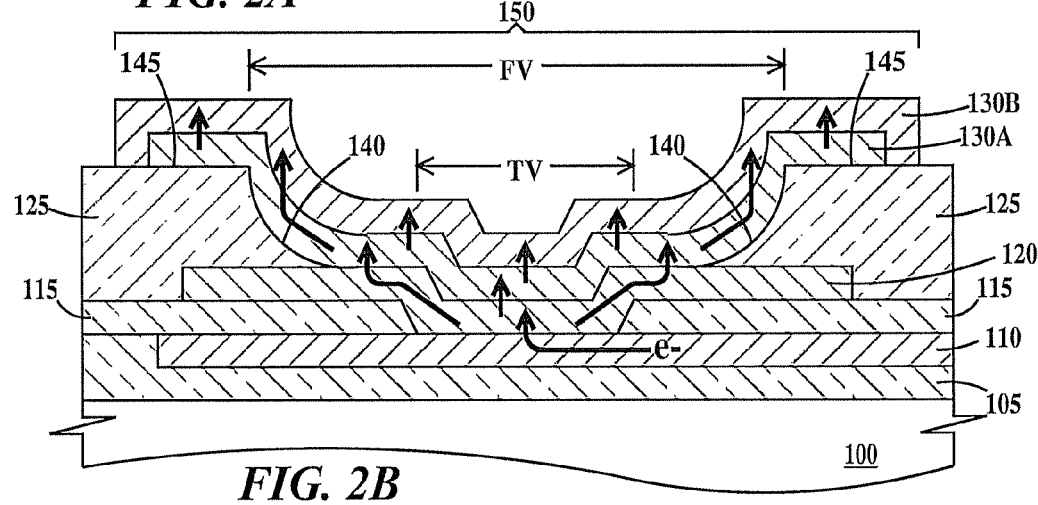
Figure 6A:
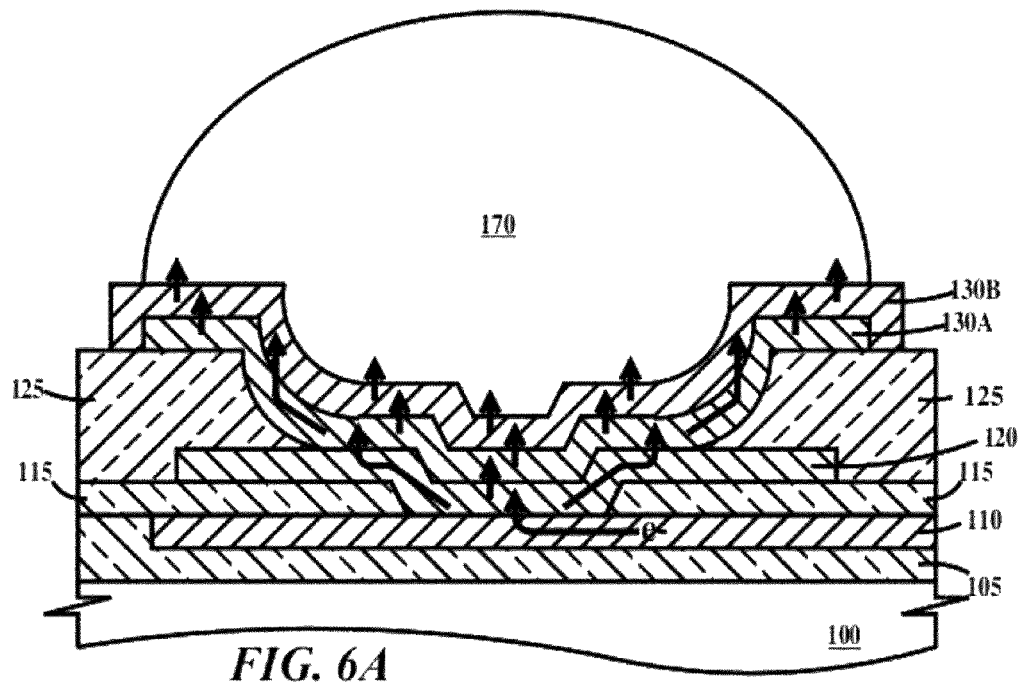
FIGS. 6A, 6B, 6C and 6D are cross-sections of the solder interconnect pads of respective FIGS. 2B, 3B, 4B and 5B having a solder bumper formed thereon according to the respective embodiments of the present invention.

FIG. 2A is a plan view and FIG. 2B is a cross-section view through 2B-2B of FIG. 2A of a solder interconnect pad according to a first embodiment of the present invention. Formed on a substrate 100 is a set (not fully shown) of interlevel dielectric layers containing wires. Formed on interlevel dielectric layer 105 is an electrically conductive wire 110. Interlevel dielectric layer 105 is an uppermost interlevel dielectric layer of a set of interlevel dielectric layers in substrate 100 and wire 110 is an uppermost wire if a set of wires formed in corresponding interlevel dielectric layers. Wire 110 is formed in dielectric layer 105. There are regions (not shown) where a top surface of dielectric layer 105 is coplanar with a top surface of wire 110. Formed on a top surface of wire 110 (and interlevel dielectric layer 105 where interlevel dielectric layer is not covered by wire 110, not shown) is a dielectric passivation layer 115. Formed in dielectric passivation layer 115 is a opening TV. Formed on a top surface of dielectric passivation layer 115 is an electrically conductive terminal pad 120. In opening TV, a region of pad 120 is in physical and electrical contact with wire 110. Formed on a top surface of terminal pad 120 is a dielectric organic dielectric passivation layer 125. Organic dielectric passivation layer 125 is also formed on the top surface of dielectric passivation layer 115 where dielectric passivation layer 115 is not covered by terminal pad 120. Formed in organic dielectric passivation layer 125 is a opening FV. Organic dielectric passivation layer 125 has a concave sidewall 140 in opening FV. An electrically conductive current spreading pad 130A is formed on a top surface 145 and sidewalls 140 of organic dielectric passivation layer 125 and on a region of terminal pad 120 exposed in opening FV. In opening FV, the region of current spreading pad 130A is in physical and electrical contact with terminal pad 120. Formed on current spreading pad 130A is an electrically conductive solder bump pad 130B pad. Solder bump pad 130B pad is physical and electrical contact with current spreading pad 130A. A solder bump is formed only in physical and electrical contact with the top surface of solder bump pad 130B. The solder bump is illustrated in FIG. 6A.

Figure 7:
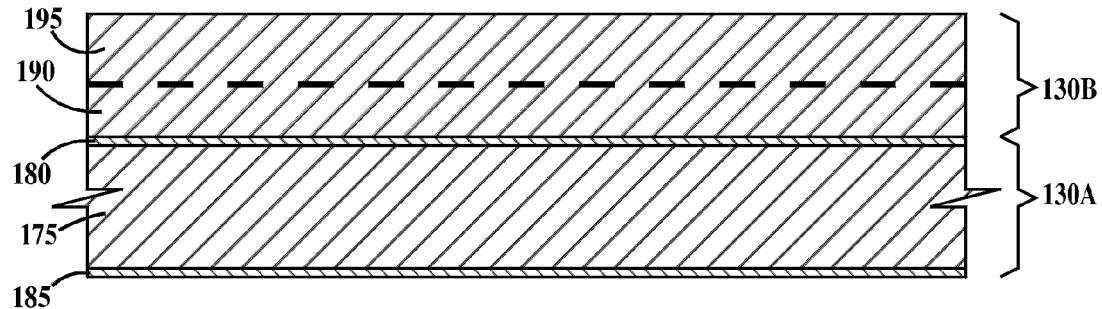
FIG. 7 is a cross-section of a current spreader according to the embodiments of the present invention.

In one example, wire 110 comprises copper. In one example, wire 110 comprises a copper core having a tantalum nitride layer formed on a bottom and sidewalls of the core and of tantalum layer formed on the tantalum nitride layer. In one example, dielectric passivation layer 115 comprises an inorganic dielectric material. In one example, dielectric passivation layer 115 comprises a layer of second formed silicon nitride on top of a layer of first formed silicon dioxide. In one example, terminal pad 120 comprises aluminum. In one example, organic dielectric layer 125 comprises polyimide. In one example, spreading layer 130A comprises aluminum. In one example, current spreading pad 130A comprises copper nickel, a layer of copper and a layer of nickel, or a mixture of copper and nickel between a lower protective layer and an upper protective layer as illustrated in FIG. 7 and described supra. The lower and upper protective plates prevent intermetallic formation between the solder bump (see FIG. 6A) metals and the metals of the core of current spreading pad 130A. In one example, solder bump pad 130B comprises a mixture of copper and nickel, only nickel, only copper or a mixture of copper and gold. When spreading pad 130A and or solder bump pad 130B comprise a mixture of two materials, co-deposited or co-plated.

When electron current flows from wire 110 into terminal pad 120 it spreads out as illustrated in FIG. 2B. From terminal pad, current flows into current spreading pad 130A. From current spreading pad 130A current flows to ball limiting metal 130B. Before any heating, such as from reflowing a solder bump (not shown) or passing current from wire 110 to the solder bump current is spread out, and the current density is relatively uniform, along the whole surface of solder bump pad 130B indicated as an area of current spreading 150 which is greater than the area of the FV opening. After heating, the area of current spreading remains the same, because either the spreading layer contained a metal that does not form intermetallics with tin or the upper protective layer of current spreading pad 130A has prevented intermetallic formation between metals of the core of current spreading pad 130A and the metals of a solder bump (see FIG. 6A) even though the metals of solder bump pad 130B may have reacted with the metals of the solder bump to form tin intermetallics. As long as the core of spreading layer is thick enough to carry the current required, and the upper and lower layers are thin enough not to add significantly to the series resistance between wire 110 and the solder bump (see FIG. 6A) the solder interconnect structure of the embodiments of the present invention will have increased electromigration performance (e.g., more uniform current flow and lower meantime to failure) than prior art structures. The cusping effect on current flow of current spreading pad 130A and solder bump pad 130B is not nearly so great as in the prior art, as current spreading pad 130A provides a path of unreacted and thus low resistance metal past the cusp toward the perimeter of solder bump pad 130B. Further, solder bump pad 130B can be made thinner than in the prior art so as to reduces its resistance, particularly if the metals of the solder bump pad for tin intermetallics.

Resistance to current flow in the direction indicated by the arrows of FIG. 2B is directly proportional to the thickness of the various conductive structures and inversely proportional to the area of the same structures (see FIG. 2A). Failures in solder interconnect structures are manifested as decreased current flow, increased resistance or open circuits.

While the perimeter of solder bump pad 130B is illustrated as extending past the perimeter of current spreading pad 130A, alternatively, the perimeter of current spreading pad 130A may extend past the perimeter of solder bump pad 130B or the perimeters of current spreading pad 130A and solder bump pad 130B may align to each other. While opening TV is illustrated as circular, it may be polygonal (e.g., square or rectangular) as illustrated by the dashed lines.

Figure 3A:
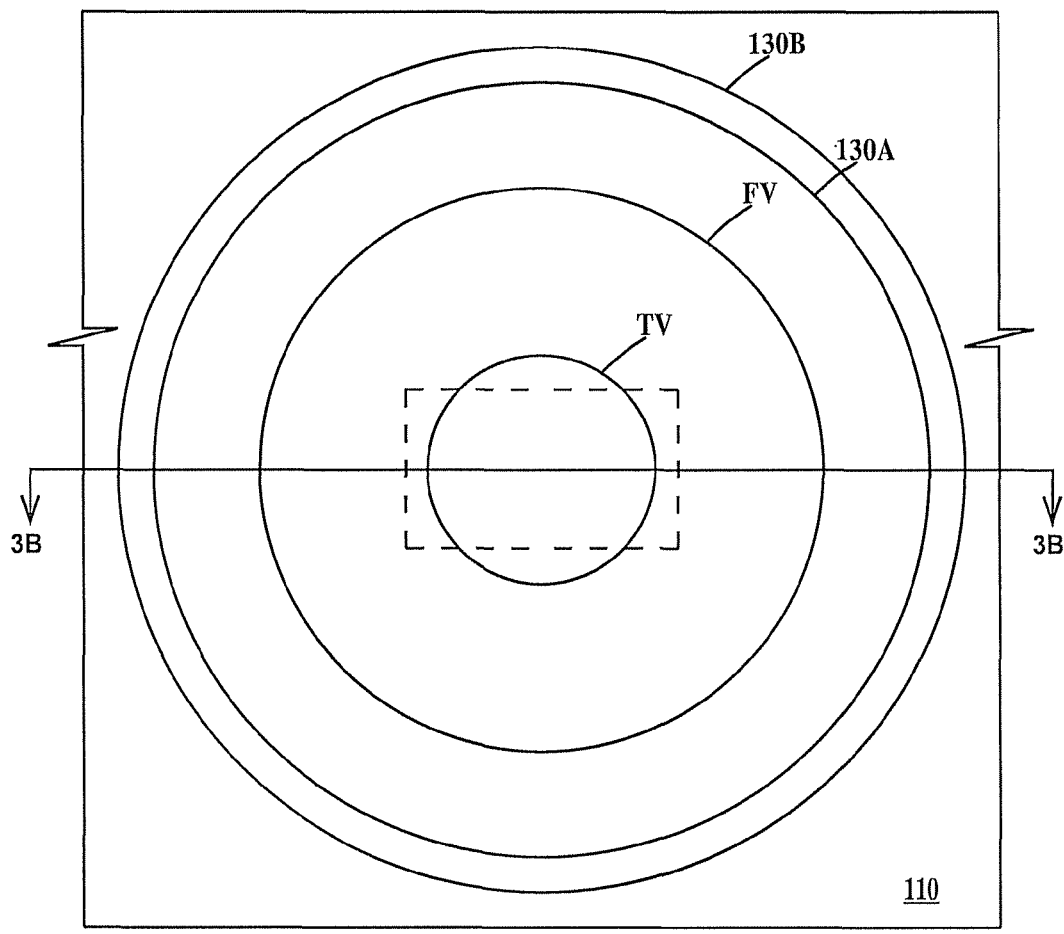
FIG. 3A is a plan view and FIG. 3B is a cross-section view through 3B-3B of FIG. 3A of a solder interconnect pad according to a second embodiment of the present invention.
Figure 3B:
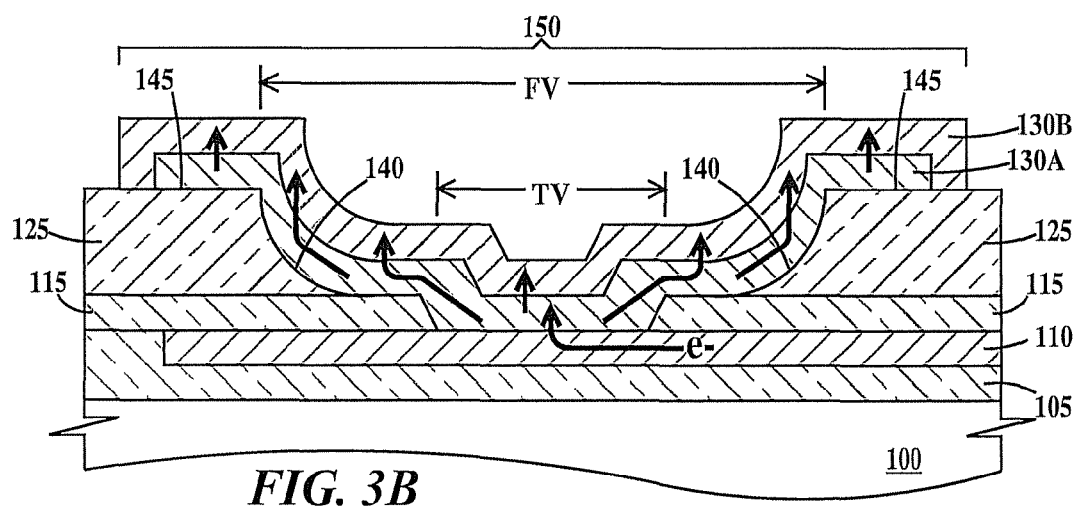
Figure 6B:
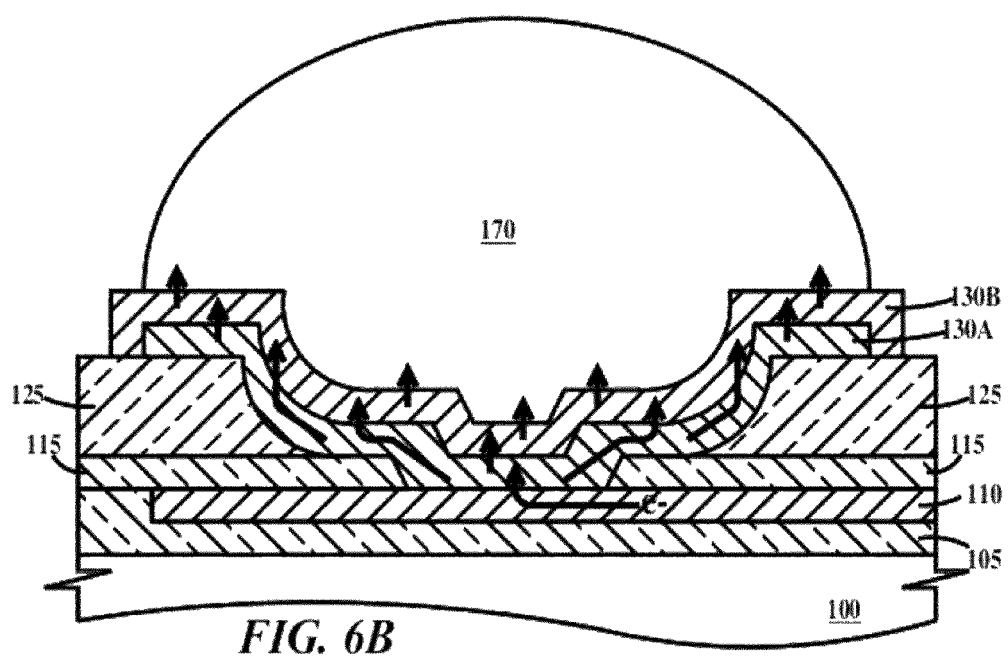

FIG. 3A is a plan view and FIG. 3B is a cross-section view through 3B-3B of FIG. 3A of a solder interconnect pad according to a second embodiment of the present invention. The second embodiment of the present invention is similar to the first embodiment of the present invention except terminal pad 120 (see FIGS. 2A and 2B) is not present so a region of current spreading pad 130A is in physical and electrical contact with wire 110. A solder bump is formed only in physical and electrical contact with the top surface of solder bump pad 130B. The solder bump is illustrated in FIG. 6B.

Figure 4A:
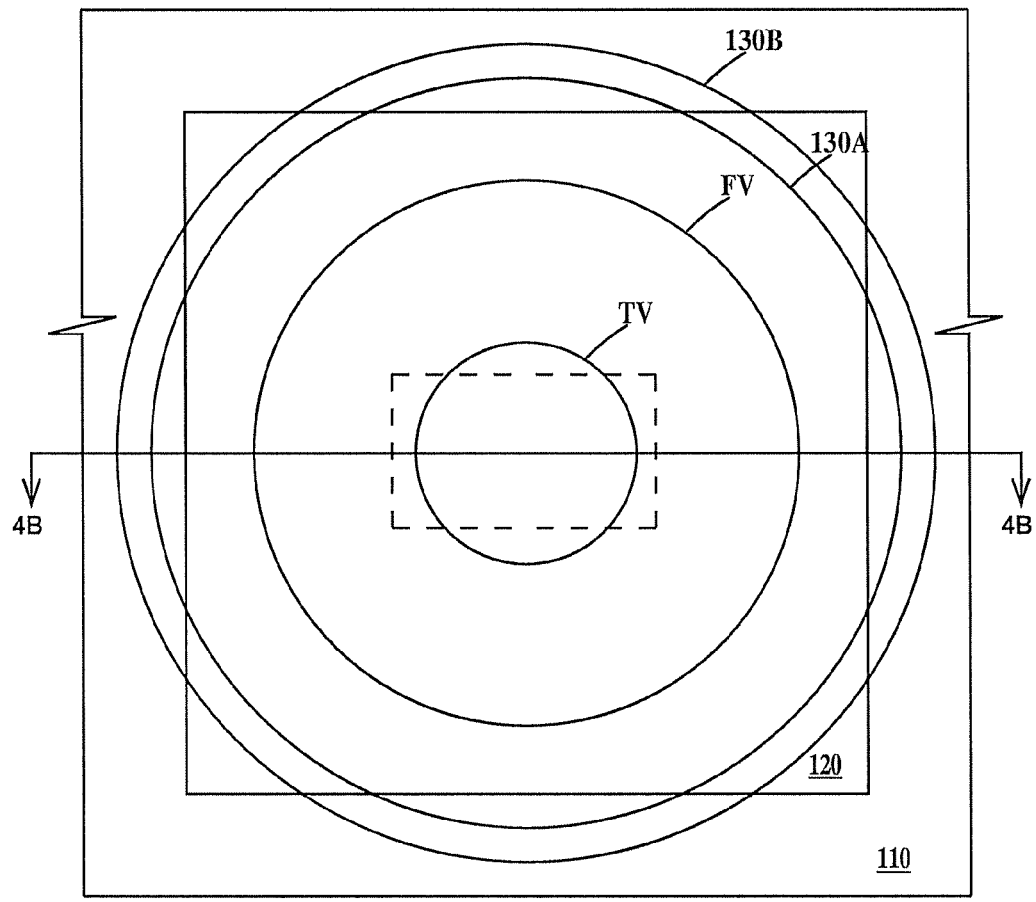
FIG. 4A is a plan view and FIG. 4B is a cross-section view through 4B-4B of FIG. 4A of a solder interconnect pad according to a third embodiment of the present invention.
Figure 4B:
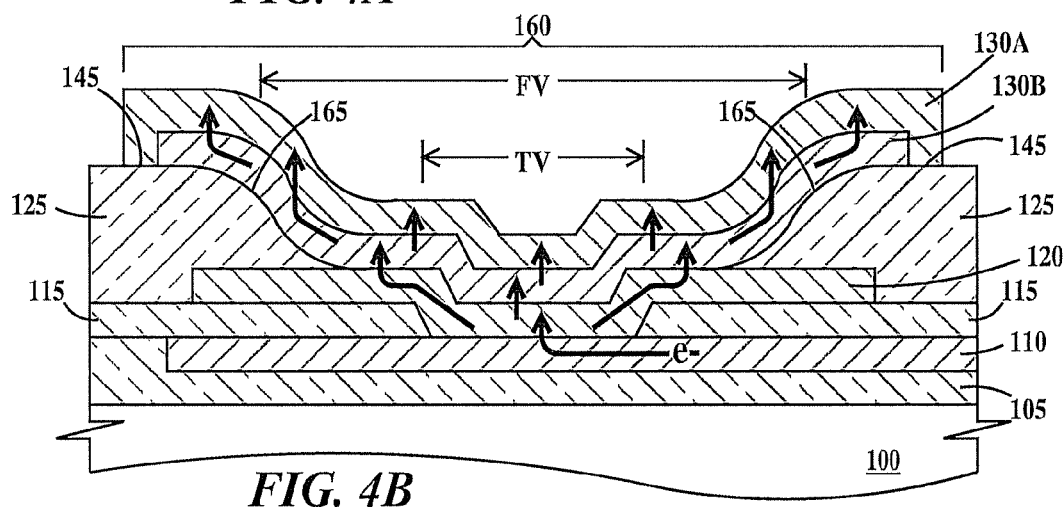
Figure 6C:
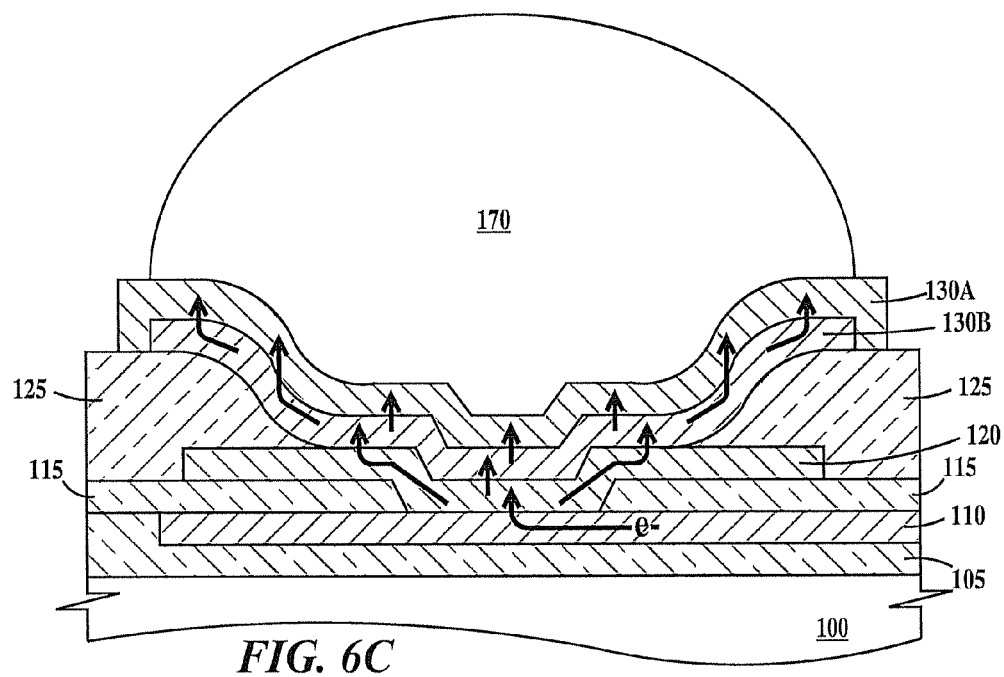
Figure 6D:
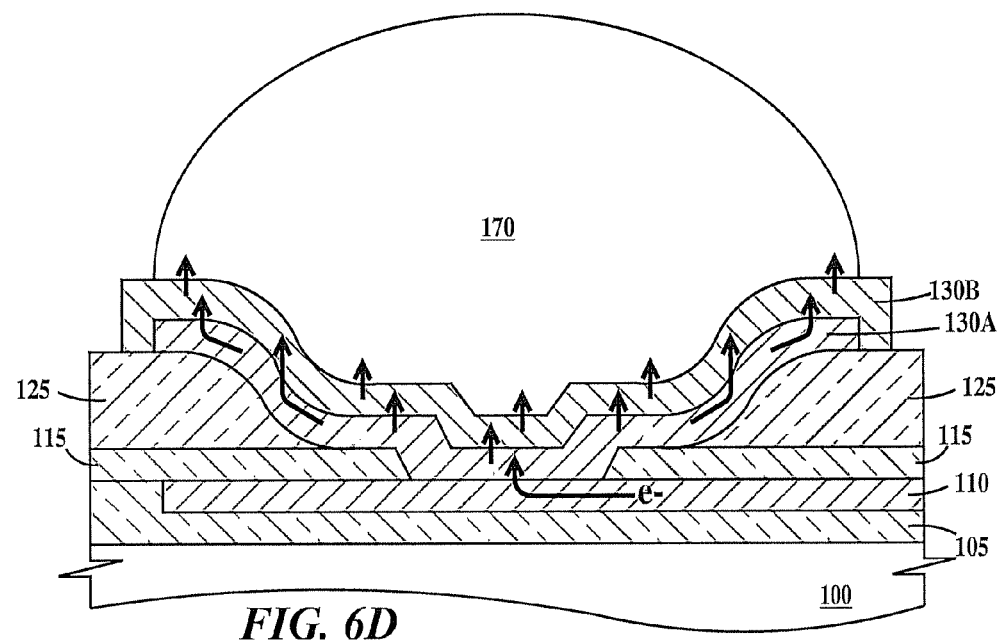

FIG. 4A is a plan view and FIG. 4B is a cross-section view through 4B-4B of FIG. 4A of a solder interconnect pad according to a third embodiment of the present invention. The third embodiment of the present invention is similar to the first embodiment of the present invention except organic dielectric passivation layer 125 has an ogee profile (elongated "S" shaped) sidewall 165 in opening FV instead of a concave sidewall 145 (see FIG. 2B). An ogee profile has a convex portion at a first end and a concave portion an opposite second end. The convex portion of sidewall 165 is adjacent to top surface 145 of organic dielectric passivation layer 125. The concave portion of sidewall 165 is adjacent to terminal pad 125. The ogee of sidewall 165 allows an increased current flow to regions of solder bump pad proximate to the perimeter of the solder bump pad. So the current density of solder bump pad 130B in area of current spreading 160 of FIG. 4B is more uniform than the current density of solder bump pad 130B in area of current spreading 150 of FIG. 2B. A solder bump is formed only in physical and electrical contact with the top surface of solder bump pad 130B. The solder bump is illustrated in FIG. 6C.

Figure 5A:
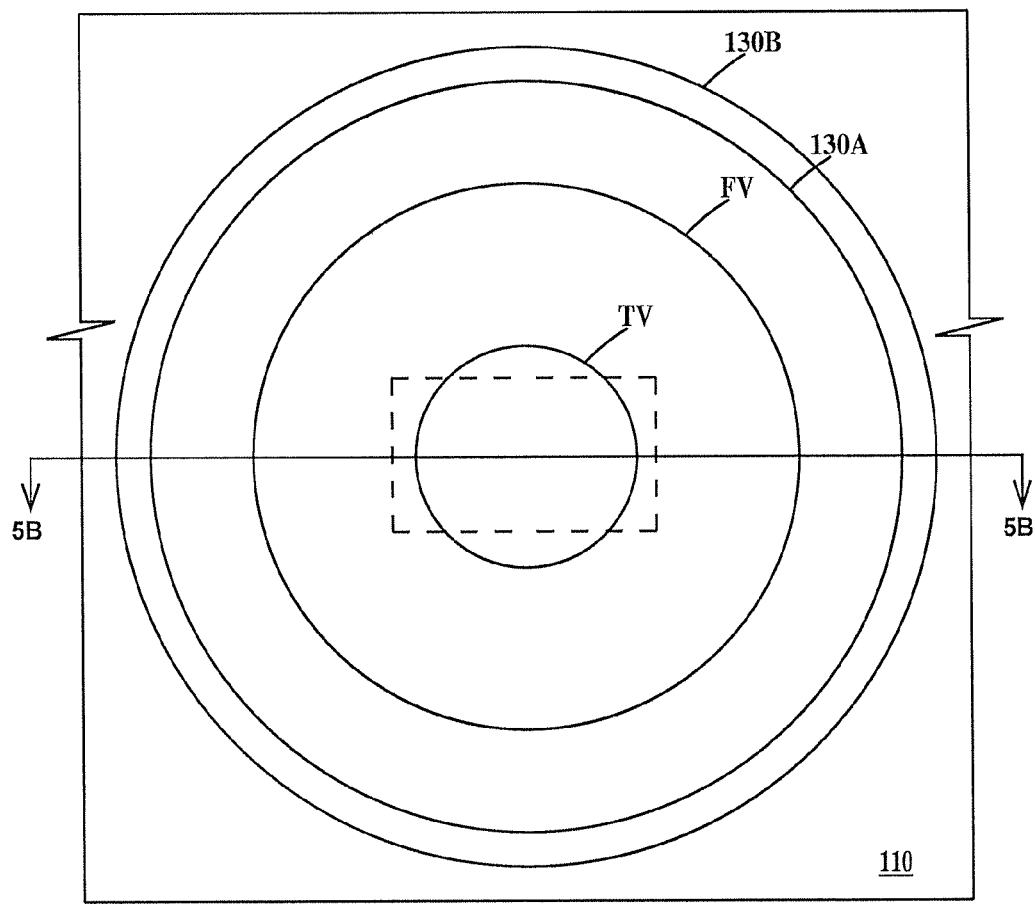
FIG. 5A is a plan view and FIG. 5B is a cross-section view through 5B-5B of FIG. 5A of a solder interconnect pad according to a fourth embodiment of the present invention.
Figure 5B:
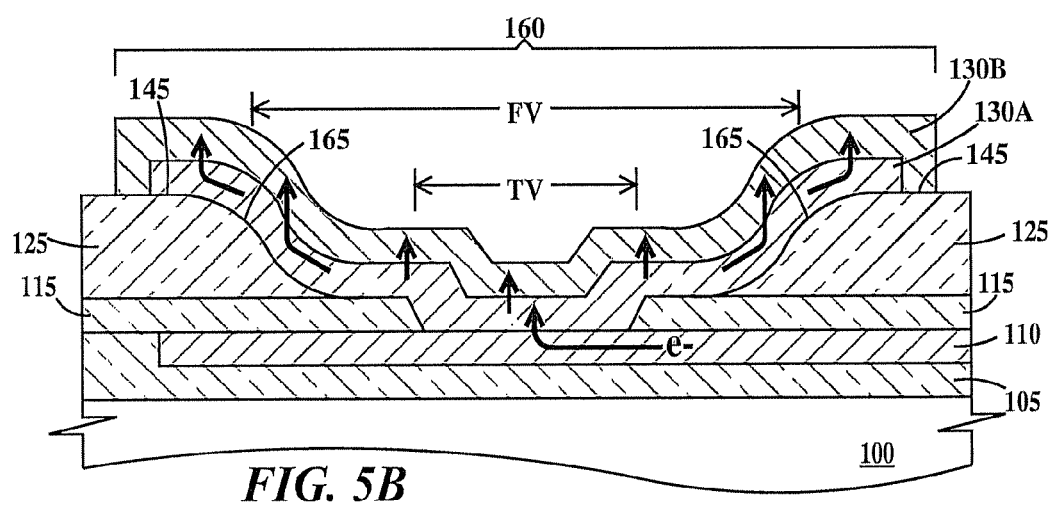

FIG. 5A is a plan view and FIG. 5B is a cross-section view through 5B-5B of FIG. 5A of a solder interconnect pad according to a fourth embodiment of the present invention. The fourth embodiment of the present invention is similar to the third embodiment of the present invention except terminal pad 120 (see FIGS. 4A and 4B) is not present so a region of current spreading pad 130A is in physical and electrical contact with wire 110. A solder bump is formed only in physical and electrical contact with the top surface of solder bump pad 130B. The solder bump is illustrated in FIG. 6A.

FIGS. 6A, 6B, 6C and 6D are cross-sections of the solder interconnect pads of respective FIGS. 2B, 3B, 4B and 5B having a solder bumper formed thereon according to the embodiments of the present invention. In FIGS. 6A, 6B, 6C and 6D a solder bump 170 is formed on solder bump pad 130B. In one example, solder bump 170 comprises only lead, only tin, a mixture of lead and tin, a mixture of tin and silver, a mixture of tin and copper, or a mixture of tin, silver and copper.

In a first preferred embodiment of the present invention, spreading layer 130A comprises a first formed layer of titanium, a second formed layer of titanium nitride, a third formed layer of aluminum, a fourth formed layer of titanium and a fifth formed layer of titanium nitride; solder bump pad 130B comprises either co-deposited nickel and copper or a first formed layer of nickel and a second formed layer of copper; solder bump 170 comprises a mixture of tin and silver. Titanium and titanium nitride are deposited (e.g., by sputtering or evaporation). Aluminum, nickel, copper, tin and silver may independently be evaporated or plated. When copper is deposited, a thin layer of gold is deposited on top of the copper layer. The gold layer is not needed when copper is plated.

In a second preferred embodiment of the present invention, spreading layer 130A comprises a first formed layer of tantalum, a second formed layer of tantalum nitride, a third formed layer of copper, a fourth formed layer of tantalum and a fifth formed layer of tantalum nitride; solder bump pad 130B comprises either co-deposited nickel and copper or a first formed layer of nickel and a second formed layer of copper; solder bump 170 comprises a mixture of tin and silver. Tantalum and tantalum nitride are deposited (e.g., by sputtering or evaporation). Nickel, copper, tin and silver may independently be evaporated or plated. When copper is deposited, a thin layer of gold is deposited on top of the copper layer. The gold layer is not needed when copper is plated.

In a third preferred embodiment of the present invention, spreading layer 130A comprises a first formed layer of titanium, a second formed layer of titanium nitride, a third formed layer of nickel, a fourth formed layer of titanium and a fifth formed layer of tungsten; solder bump pad 130B comprise either co-deposited nickel and copper or a first formed layer of copper and a second formed layer of nickel; solder bump 170 comprises a mixture of tin and silver. Titanium, titanium nitride and tungsten are deposited (e.g., by sputtering or evaporation). Nickel, copper, tin and silver may independently be evaporated or plated. The fourth formed layer of titanium and a fifth form layer of tungsten may be replaced with a layer of co-deposited titanium and tungsten. When copper is deposited, a thin layer of gold is deposited on top of the copper layer. The gold layer is not needed when copper is plated.

FIG. 7 is a cross-section of a current spreader according to the embodiments of the present invention. In FIG. 7, spreader pad 130A and solder bump pad 130B are illustrated. Spreader pad 130A includes an electrically conductive core layer 175 an optional electrically conductive upper protective layer 185 and an electrically conductive optional lower protective layer 180. Upper and lower protective layers 180 and 185 may themselves comprise two or more layers, a mixture of two or more electrical conductors or a single material. When core conductive layer 175 is non-reactive solder bump 170 (see, FIGS. 6A, 6B, 6C and 6D), then upper protective layer 180 may be eliminated. When core layer 175 is non-reactive with terminal pad 120 (see for example FIGS. 6A and 6C), then lower protective layer 185 may be eliminated. When there is no terminal pad and core conductive layer is non-reactive with wire 110 (see for example FIGS. 6B and 6D), lower protective layer 185 may be eliminated. Lower protective layer may act as a copper diffusion barrier and/or an adhesion-enhancing layer.

When used, it is advantageous for upper and lower protective layers to be kept as thin as possible and still act as a diffusion barrier in order to reduce electrical resistance because layers that act a diffusion barriers often have high resistivity than core conductor 175. In one example upper and lower protective layers are each between about 25 nm and about 75 nm thick if present and spreading layer is between about 1 micron and about 2 microns thick.

As discussed supra, solder bump pad 130B may consist of a single layer (which may include more than one material) or two layers, a lower layer 190 and an upper layer 195 as indicated by the dashed line. In an alternative arrangement of layers, upper protective layer 180 may be formed as part of solder bump pad 130B instead of spreader pad 130A.

In the embodiments of the present invention, the materials of the solder bump pad will react with the materials of the solder bump, forming intermetallic compounds while either (1) the materials of the spreading layer will not react with the materials of the solder bump or (2) when the material of the spreading layer will react with the materials of the solder bump, a protective layer is formed between the current spreading pad and the solder bump pad to prevent the reaction and intermetallic formation. The protective layer acts as a diffusion barrier preventing atoms of the solder bump (particularly tin) from diffusing into the current spreading pad and atoms of the current spreading pad from diffusing into the solder bump pad.

Figure 8:
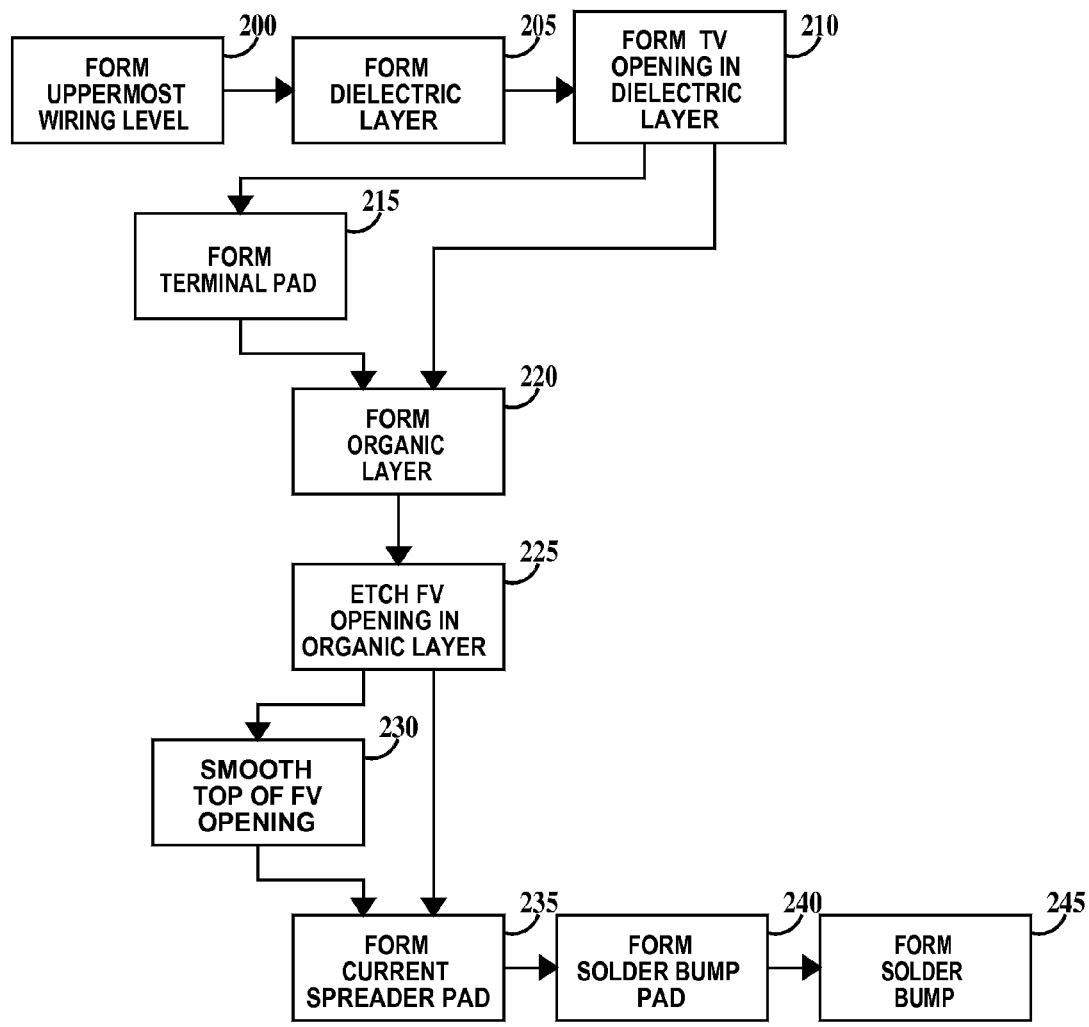
FIG. 8 is a flowchart illustrating the fabrication of solder interconnects according to the embodiments of the present invention.

FIG. 8 is a flowchart illustrating the fabrication of solder interconnects according to the embodiments of the present invention. In step 200, an uppermost wiring level of substrate having set of wiring levels is formed (or provided). In step 205 a dielectric passivation layer is formed over the uppermost wiring layer. In step 210, the TV opening is formed in the dielectric passivation layer, exposing a top surface of a wire of the uppermost wiring level in the bottom of the TV opening.

Next the method proceeds either to step 215 or to step 220. In step 215, a terminal pad is formed on the top surface of wire exposed in the TV opening, on sidewalls of the dielectric passivation layer in the TV opening and on the top surface of the dielectric passivation layer adjacent to the perimeter of the TV opening. From step 215 the method proceeds to step 220.

In step, 220 an organic dielectric passivation layer is formed (1) on terminal pad and regions of the dielectric passivation layer not covered by the terminal pad if step 215 is performed or (2) on the dielectric passivation layer and regions of the wire exposed in the TV opening if step 215 is not performed.

Next, in step 225 a FV opening is etched in the organic dielectric passivation layer. Either (1) a region of the top surface of the terminal pad is exposed in the bottom if the FV opening if step 215 is performed or (2) the top surface of the wire previously exposed in the TV opening and a region of the top surface of the dielectric passivation layer surrounding the TV opening are exposed if step 215 is not performed. In one example, the FV opening is formed by forming a patterned layer of photoresist on the organic dielectric passivation layer and isotropically etching the organic dielectric passivation (e.g., wet etch using a solvent). Isotropic etching forms the concave sidewalls of the TV opening and cusp at the interface between the top surface and the sidewalls of the organic dielectric passivation layer as illustrated in FIGS. 2B, 3B, 6A and 6B. The etched organic dielectric passivation layer may be then heat or UV cured.

Next the method proceeds either to step 230 or 235. In step 230 the cusp is removed and the profile of the sidewalls changed from concave to an ogee with the convex portion of the ogee adjacent to the top surface of the organic dielectric passivation layer. In one example, the removal or "rounding-off" of the cusp is accomplished by a sputtering process (e.g., with argon) after the photoresist has been removed. From step 230 the method proceeds to step 235.

In step 235, a current spreading pad is formed. If step 215 was performed then in step 235 the current spreading pad is formed over the top surface of terminal pad exposed in the TV opening, the sidewalls of the FV opening in the organic dielectric passivation layer and a region of the top surface of the organic dielectric passivation layer adjacent to the TV opening. If step 215 was not performed, then in step 235 the current spreading pad is formed over the top surface of wire exposed in the TV opening, regions of dielectric passivation exposed in the FV opening in the organic dielectric passivation layer, the sidewalls of the FV opening in the organic dielectric passivation layer and a region of the top surface of the organic dielectric passivation layer adjacent to the TV opening. From step 235 the method proceeds to step 240.

In step 240, a solder bump pad is formed on the current spreading pad. Then in step 245, a solder bump is formed on top of the solder bump pad. At some point during formation of the solder bump pad or afterwards, some or all of the solder bump pad reacts with the solder bump to form intermetallic compounds that have a higher resistivity than the resistivity of the unreacted terminal pad. The current spreading pad or at least one layer the current spreading pad does not react with the solder bump and does not form intermetallic compounds.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a wire that is electrically conductive in an interlevel dielectric layer on a substrate;
a dielectric passivation layer formed on a top surface of said wire and on a top surface of said interlevel dielectric layer;
a first opening in said dielectric passivation layer, wherein a central region of said top surface of said wire is exposed in said first opening;
a terminal pad that is electrically conductive on said central region of said top surface of said wire in said first on a region of said top surface of said dielectric passivation layer surrounding said first opening;
an organic dielectric passivation layer on said dielectric passivation layer and said terminal pad;
a second opening in said organic dielectric passivation layer, a central region of a top surface of said terminal pad exposed in said second opening, said organic passivation layer extending over and in contact with a peripheral region of said terminal pad;
a current spreading pad that is electrically conductive on a top surface of said organic dielectric passivation layer;
a solder bump pad that is electrically conductive, said solder bump pad comprising one or more layers on a top surface of said current spreading pad; and
a solder bump that is electrically conductive on a top surface of said solder bump pad, said solder bump containing tin, said solder bump pad on a top surface of said terminal pad, said current spreading pad comprising one or more layers, at least one of said one or more layers consisting of a material that will not form an intermetallic with tin or at least one of said one or more layers is a material that is a diffusion barrier to tin and is adjacent to said solder bump pad.

2. The structure of claim 1, wherein a sidewall of said second opening in said dielectric organic passivation layer is concave.

3. The structure of claim 1, wherein said wire comprises copper.

4. The structure of claim 1, wherein said current spreading pad comprises:
   an aluminum layer; or
   a nickel layer and a diffusion barrier layer to tin, said diffusion barrier layer to tin between said nickel layer and said solder bump pad; or
   a copper layer and said diffusion barrier layer to tin, said diffusion barrier layer to tin between said copper layer and said solder bump pad; or
   a layer of a mixture of nickel and copper and said diffusion barrier layer to tin, said diffusion barrier layer to tin between said layer of said mixture and said solder bump pad; or
   said nickel layer, said copper layer and said diffusion barrier layer to tin, said diffusion barrier layer to tin between said layers of nickel and copper and said solder bump pad.

5. The structure of claim 1, wherein said current spreading pad comprises:
   a diffusion barrier layer and an aluminum layer, said aluminum layer between said diffusion barrier layer and said solder bump pad; or
   a first diffusion barrier layer, a nickel layer and a second diffusion barrier layer, said second diffusion barrier layer being a diffusion barrier to tin, said nickel layer between said first diffusion barrier layer and said second diffusion barrier layer, said second diffusion barrier layer between said nickel layer and said solder bump pad; or
   said first diffusion barrier layer, a copper layer and said second diffusion barrier layer, said copper layer between said first diffusion barrier layer and said second diffusion barrier layer, said second diffusion barrier layer between said copper layer and said solder bump pad; or
   said first diffusion barrier layer, a layer of a mixture of nickel and copper and said second diffusion barrier layer, said mixture of nickel and copper between said first diffusion barrier layer and said second diffusion barrier layer, said second diffusion barrier layer between said layer of said mixture and said solder bump pad; or
   said first diffusion barrier layer, said nickel layer, said copper layer and said second diffusion barrier layer, said layers of nickel and copper between said first diffusion barrier layer and said second diffusion barrier layer, said second diffusion barrier layer between said layers of nickel and copper and said solder bump pad.

6. The structure of claim 1, wherein said solder bump pad comprises:
   a layer of copper; or
   a layer of nickel, or
   said layer of copper and said layer of nickel, or
   a layer of a mixture of copper and nickel.

* * * * *